(12) United States Patent
Kang et al.

(10) Patent No.: US 9,246,132 B2
(45) Date of Patent: Jan. 26, 2016

(54) FLEXIBLE ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Dong-Hun Kang, Yongin (KR); Young-Seo Choi, Yongin (KR); Dong-Won Han, Yongin (KR); Oh-June Kwon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/273,466

(22) Filed: May 8, 2014

(65) Prior Publication Data
US 2015/0188084 A1  Jul. 2, 2015

(30) Foreign Application Priority Data
Jan. 2, 2014  (KR) .......... 10-2014-0000408

(51) Int. Cl.
*H01L 51/00* (2006.01)
*H01L 51/52* (2006.01)
*H01L 27/32* (2006.01)
*H01L 51/56* (2006.01)

(52) U.S. Cl.
CPC ........ *H01L 51/5259* (2013.01); *H01L 27/3244* (2013.01); *H01L 51/0097* (2013.01); *H01L 51/5253* (2013.01); *H01L 51/56* (2013.01)

(58) Field of Classification Search
CPC ............ H01L 51/5237; H01L 51/5253; H01L 51/5256; H01L 51/5259; H01L 27/32; H01L 51/0097
USPC ............................................... 257/40, 59, 72
See application file for complete search history.

(56) References Cited

U.S. PATENT DOCUMENTS

| | | | |
|---|---|---|---|
| 2005/0269948 A1 | 12/2005 | Tanaka | |
| 2013/0146875 A1* | 6/2013 | Mandlik et al. | ........... 257/52 |
| 2013/0171902 A1 | 7/2013 | Wang et al. | |
| 2013/0188324 A1 | 7/2013 | Lee et al. | |
| 2014/0175405 A1* | 6/2014 | Yeh et al. | ........... 257/40 |
| 2014/0183478 A1* | 7/2014 | Lee et al. | ........... 257/40 |

FOREIGN PATENT DOCUMENTS

| | | |
|---|---|---|
| JP | 2001-176653 | 6/2001 |
| JP | 2002-260847 | 9/2002 |
| JP | 2003-086352 | 3/2003 |
| JP | 2005-347083 | 12/2005 |

* cited by examiner

*Primary Examiner* — Tu-Tu Ho
(74) *Attorney, Agent, or Firm* — Christie, Parker & Hale, LLP

(57) ABSTRACT

A flexible organic light-emitting display apparatus includes a flexible substrate, a barrier layer on the flexible substrate, a display portion on the barrier layer, an encapsulation layer covering the display portion, and a moisture absorption layer between the flexible substrate and the display portion.

13 Claims, 4 Drawing Sheets

FLEXIBLE ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2014-0000408, filed on Jan. 2, 2014, in the Korean Intellectual Property Office, the disclosure of which is incorporated herein by reference in its entirety.

BACKGROUND

1. Field

Aspects of embodiments of the present invention relate to flexible organic light-emitting display apparatuses that are flexibly modifiable and methods of manufacturing the flexible organic light-emitting display apparatuses.

2. Description of the Related Art

In general, a flexible display apparatus is an apparatus with flexibility added to a display portion that is formed on a flexible substrate, such as a polyimide substrate. The flexible display apparatus is very convenient since the volume of the flexible display apparatus to be carried by a user is reduced due to the modifications to the shape.

SUMMARY

Aspects of embodiments of the present invention include flexible organic light-emitting display apparatuses and methods of manufacturing the flexible organic light-emitting display apparatuses.

Additional aspects will be set forth in part in the description which follows and, in part, will be apparent from the description, or may be learned by practice of the presented embodiments.

According to one or more embodiments of the present invention, a flexible organic light-emitting display apparatus includes: a flexible substrate, a barrier layer formed on the flexible substrate, a display portion formed on the barrier layer, an encapsulation layer covering the display portion, and a moisture absorption layer between the flexible substrate and the display portion.

The moisture absorption layer may include CaO and/or MgO.

The moisture absorption layer may be between the flexible substrate and the barrier layer.

The flexible substrate may include a plurality of flexible substrates, and the barrier layer may include a plurality of barrier layers, where the flexible substrates and barrier layers may be alternately stacked, and the moisture absorption layer may be between a first flexible substrate of the plurality of flexible substrates and a first barrier layer of the plurality of barrier layers, the first flexible substrate being closest to the display portion from among the plurality of flexible substrates and the first barrier layer being closest to the display portion from among the plurality of barrier layers.

The moisture absorption layer may be between the barrier layer and the display portion.

The flexible substrate may include a plurality of flexible substrates and the barrier layer may include a plurality of barrier layers, where the flexible substrates and the barrier layers may be alternately stacked, and the moisture absorption layer may be between the first barrier layer of the plurality of barrier layers that is closest to the display portion from among the plurality of barrier layers and the display portion.

According to one or more embodiments of the present invention, a method of manufacturing a flexible organic light-emitting display apparatus includes: forming a flexible substrate on a carrier substrate; forming a barrier layer on the flexible substrate; forming a display portion on the barrier layer; covering the display portion with an encapsulation layer; and forming a moisture absorption layer between the flexible substrate and the display portion.

The moisture absorption layer may include CaO and/or MgO.

The moisture absorption layer may be formed between the flexible substrate and the barrier layer.

The flexible substrate may include a plurality of flexible substrates and the barrier layer may include a plurality of barrier layers, where the flexible substrates and the barrier layers may be alternately stacked, and the moisture absorption layer may be between a first flexible substrate of the plurality of flexible substrates and a first barrier layer of the plurality of barrier layers, the first flexible substrate being closest to the display portion from among the plurality of flexible substrates and the first barrier layer being closest to the display portion from among the plurality of barrier layers.

The moisture absorption layer may be between the barrier layer and the display portion.

The flexible substrate may include a plurality of flexible substrates and the barrier layer may include a plurality of barrier layers, where the flexible substrates and the barrier layers may be alternately stacked, and the moisture absorption layer may be between a first barrier layer that is closest to the display portion from among the plurality of barrier layers and the display portion.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
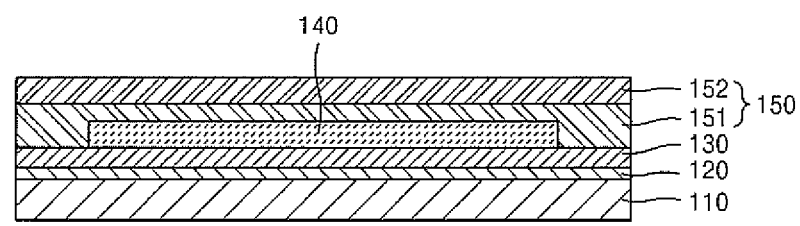
FIG. 1 is a cross-sectional view of a flexible organic light-emitting display apparatus, according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of illustration. In other words, since sizes and thicknesses of components in the drawings are arbitrarily illustrated for the convenience of illustration, the following embodiments are not limited thereto.

When a certain embodiment may be implemented differently, a specific process order may be performed differently from the described order. For example, two consecutively described processes may be performed at substantially the same time or performed in an order that is the same or opposite to the described order.

FIG. 1 is a cross-sectional view of a flexible organic light-emitting display apparatus, according to an embodiment of the present invention. The flexible organic light-emitting display apparatus of the present embodiment as shown in FIG. 1 includes a stack structure of a flexible substrate 110 formed of a polyimide material, a barrier layer 130, a display portion 140 including a thin film transistor (TFT) and an emission layer, and a thin film encapsulation layer 150 in which organic layers 151 and inorganic layers 152 are alternately disposed. That is, a structure is implemented in which the display portion 140 is sealed by using the flexible substrate 110 and the thin film encapsulation layer 150 instead of a thick and hard glass substrate. Thus, the flexible organic light-emitting display apparatus may be flexibly modified.

A moisture absorption layer 120 is formed between the flexible substrate 110 and the barrier layer 130. The moisture absorption layer 120 may be formed of a moisture absorption material, such as CaO and/or MgO, and may be formed between the flexible substrate 110 and the barrier layer 130 through deposition or coating. The moisture absorption layer 120 absorbs outside moisture to prevent the outside moisture from permeating into the display portion 140. That is, the emission layer included in the display portion 140 of the flexible organic light-emitting display apparatus is particularly vulnerable to moisture so that the emission layer may be damaged when the moisture permeates into the emission layer. In this case, a damaged region does not properly emit light, and accordingly the apparatus becomes entirely defective. However, if the moisture absorption layer 120 is formed between the flexible substrate 110 and the display portion 140 as described in FIG. 1, since the outside moisture is absorbed by the moisture absorption layer 120, the display portion 140 may be safely secured from moisture permeating it.

Meanwhile, the flexible substrate 110 may be formed of heat resistant polyimide having a glass transition temperature of 500° C. or higher. The flexible substrate 110 is a very flexible thin film substrate that replaces a conventional glass substrate.

The barrier layer 130 is a water proof layer that prevents moisture from permeating from the outside, and may be configured as, for example, an SiO/SiN multilayer. The barrier layer 130 has a multilayer structure in which SiO and SiN are stacked, and has a water vapor transmission rate of $10^{-3}$ g/m² day or lower. The moisture absorption layer 120 acts to absorb moisture. The barrier layer 130 substantially prevents the passage of moisture.

Figure 2:
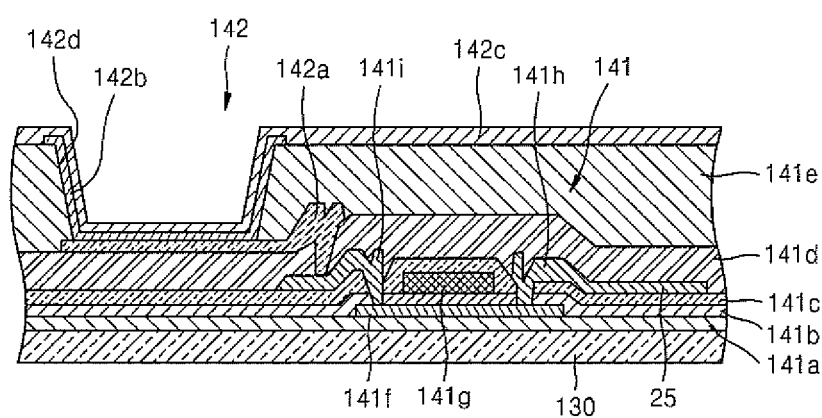
FIG. 2 is an enlarged cross-sectional view of a display portion of the flexible organic light-emitting display apparatus of FIG. 1.

The display portion 140 may be configured as shown in FIG. 2. As shown in FIG. 2, the display portion 140 includes a TFT 141 and an emission layer (EL) device 142. The EL device 142 includes an emission layer 142b that is particularly vulnerable to moisture. In more detail, a semiconductor active layer 141f is formed on a buffer layer 141a adjacent to the barrier layer 130. The semiconductor active layer 141f includes source and drain regions doped with N or P type impurities in high concentrations. The semiconductor active layer 141f may be formed of an oxide semiconductor. For example, the oxide semiconductor may include an oxide of a material selected from Group 12, 13, or 14 metal elements, such as zinc (Zn), indium (In), gallium (Ga), tin (Sn), cadmium (Cd), germanium (Ge), or hafnium (Hf), and any combinations thereof. For example, the semiconductor active layer 141f may include G-I-Z-O [$(In_2O_3)_a(Ga_2O_3)_b(ZnO)_c$] (a, b, and c are real numbers satisfying a condition that a≥0, b≥0, c>0). A gate electrode 141g is formed on the semiconductor active layer 141f with a gate insulating layer 141b disposed between the gate electrode 141g and the active layer 141f. An interlayer insulating layer 141c is formed on gate insulating layer 141b and on the gate electrode 141g. A source electrode 141h and a drain electrode 141i are formed on the interlayer insulating layer 141c. The source electrode 141h and the drain electrode 141i contact the source and drain regions of the semiconductor active layer 141f, respectively, through openings in the interlayer insulating layer 141c and the gate insulating layer 141b. A passivation layer 141d is provided between the source electrode 141h and the drain electrode 141i and an anode electrode 142a of the EL device 142.

An insulating planarization layer 141e formed of amyl is formed on the anode electrode 142a. An opening 142d is formed in the insulating planarization layer 141e and thus the EL device 142 is formed.

The EL device 142 emits red, green, and blue light according to a flow of current and displays predetermined image information. The EL device 142 includes the anode electrode 142a that is coupled, connected (e.g.) to the drain electrode 141i of the TFT 141 and receives a positive power supply from the drain electrode 141i, a cathode electrode 142c that is configured to cover whole pixels and supplies negative power, and the emission layer 142b disposed between the anode electrode 142a and the cathode electrode 142c and emits light.

A hole injection layer (HIL), a hole transport layer (HTL), an emission layer (EML), an electron transport layer (ETL), and an electron injection layer (EIL) may be stacked adjacently to the emission layer 142b.

The emission layer 142b may be separately formed for each pixel so that pixels that respectively emit red, green, and blue light form a single unit pixel. Alternatively, the emission layer 142b may be commonly formed over substantially an entire pixel region, irrespective of the positions of pixels. In this regard, the emission layer 142b may be formed by vertically stacking or mixing, for example, layers including an emission material that emits the red, green, and blue light. Of course, if white light can be emitted, it is also possible to generate other colors of light through combination. A color conversion layer that converts the emitted white light into a predetermined color or a color filter may be further included.

The emission layer 142b is highly vulnerable to moisture, and thus if moisture permeates into the display portion 140, an image forming characteristic of the flexible organic light-emitting display apparatus may quickly deteriorate.

The thin film encapsulation layer 150 formed on the display portion 140 is a layer covering and protecting the display portion 140, and has a structure in which the organic layers 151 and the inorganic layers 152 are alternately stacked.

The flexible organic light-emitting display apparatus of the above-described structure may be manufactured through the following process.

Figure 3A:
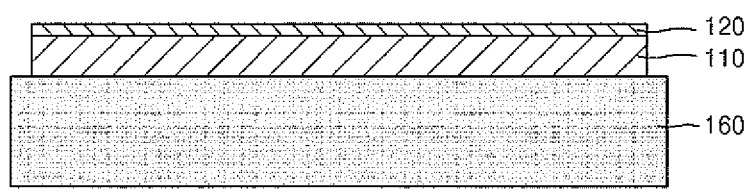
FIGS. 3A through 3C are cross-sectional views for illustrating a method of manufacturing the flexible organic light-emitting display apparatus of FIG. 1, according to an embodiment of the present invention.

As shown in FIG. 3A, a carrier substrate 160 formed of a glass material is prepared, and then thin film layers are formed thereon.

The flexible substrate 110 formed of a polyimide material is formed on the carrier substrate 160, and then the moisture absorption layer 120 is formed thereon.

Figure 3B:
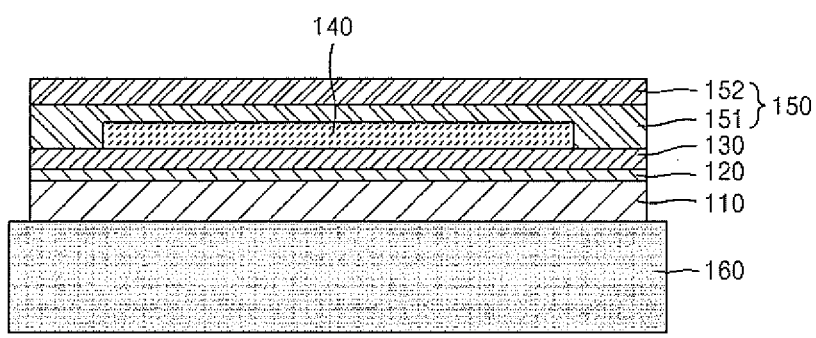

Thereafter, as shown in FIG. 3B, the barrier layer 130, the display portion 140, and the thin film encapsulation layer 150 are sequentially formed.

Figure 3C:
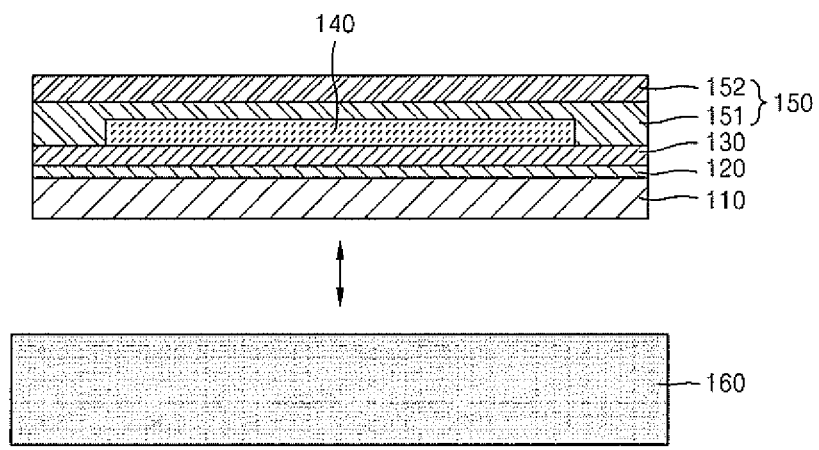

If a stack structure is completed through the above-described process, the carrier substrate 160 is separated as shown in FIG. 3C.

The above-manufactured flexible organic light-emitting display apparatus may be flexible since the flexible substrate 110 and the thin film encapsulation layer 150 surround the display portion 140, and may protect the display portion 140 from moisture more safely because the moisture absorption layer 120 absorbs moisture permeating from the outside.

Figure 4:
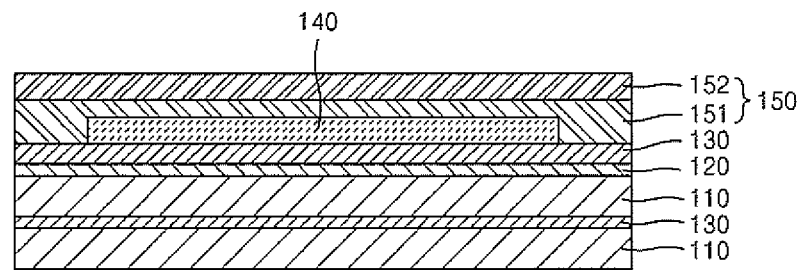
FIGS. 4 through 6 are cross-sectional views of a flexible organic light-emitting display apparatus, according to embodiments of the present invention.

Meanwhile, a structure in which the flexible substrate 110 and the barrier layer 130 are alternately disposed is shown in the above-described embodiment, whereas, as shown in FIG. 4, the structure may be modified such that a plurality of flexible substrates 110 and a plurality of barrier layers 130 are alternately disposed, and the moisture absorption layer 120 is disposed between the flexible substrate 110 and the barrier layer 130 that are closest to the display portion 140.

Figure 5:
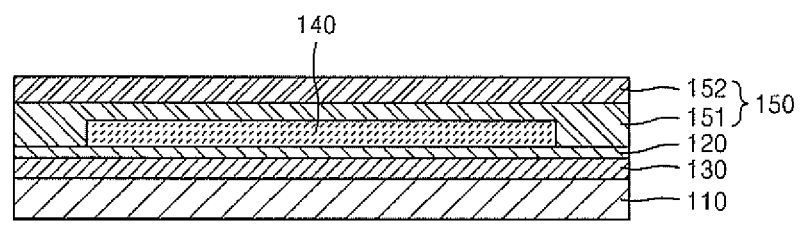

The moisture absorption layer 120 is formed between the flexible substrate 110 and the barrier layer 130 in the above-described embodiment, but is not necessarily limited thereto. At least one layer may be formed as an optional layer between the flexible substrate 110 and the display portion 140. That is, as shown in FIG. 5, the moisture absorption layer 120 may be formed not between the flexible substrate 110 and the barrier layer 130 but between the barrier layer 130 and the display portion 140.

Figure 6:
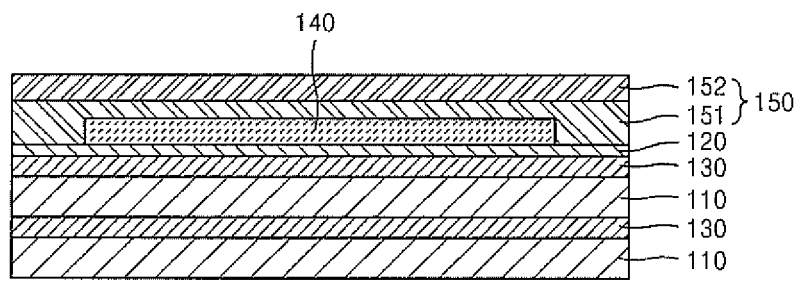

As shown in FIG. 6, in the structure in which the plurality of flexible substrates 110 and the plurality of barrier layers 130 are alternately disposed, the moisture absorption layer 120 may be formed between the barrier layer 130 closest to the display portion 140 and the display portion 140.

As described above, according to the flexible organic light-emitting display apparatus of the above-described structure and the method of manufacturing the flexible organic light-emitting display apparatus, a moisture absorption layer is used to enhance a water proof function, and thus damage to a display portion may be greatly reduced, thereby greatly improving the lifetime and reliability of the product.

It should be understood that the exemplary embodiments described therein should be considered as descriptive only and not for the purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and their equivalents.

What is claimed is:

1. A flexible organic light-emitting display apparatus comprising:
a flexible substrate, a barrier layer on the flexible substrate;
a display portion on the barrier layer, the display portion comprising a thin film transistor;
an encapsulation layer covering the display portion; and
a moisture absorption layer between the flexible substrate and the thin film transistor of the display portion,
wherein the barrier layer and the moisture absorption layer are each continuous across the display portion.

2. The flexible organic light-emitting display apparatus of claim 1, wherein the moisture absorption layer comprises CaO and/or MgO.

3. The flexible organic light-emitting display apparatus of claim 1, wherein the moisture absorption layer is between the flexible substrate and the barrier layer.

4. The flexible organic light-emitting display apparatus of claim 1, wherein the flexible substrate comprises a plurality of flexible substrates and the barrier layer comprises a plurality of barrier layers, the flexible substrates and the barrier layers being alternately stacked, and
wherein the moisture absorption layer is between a first flexible substrate of the plurality of flexible substrates and a first barrier layer of the plurality of barrier layers, the first flexible substrate being closest to the display portion from among the plurality of flexible substrates and the first barrier layer being closest to the display portion from among the plurality of barrier layers.

5. The flexible organic light-emitting display apparatus of claim 1, wherein the moisture absorption layer is between the barrier layer and the display portion.

6. The flexible organic light-emitting display apparatus of claim 1, wherein the flexible substrate comprises a plurality of flexible substrates and the barrier layer comprises a plurality of barrier layers, the flexible substrates and the barrier layers being alternately stacked, and
wherein the moisture absorption layer is between a first barrier layer closest to the display portion from among the plurality of barrier layers and the display portion.

7. A method of manufacturing a flexible organic light-emitting display apparatus, the method comprising:
forming a flexible substrate on a carrier substrate;
forming a barrier layer on the flexible substrate;
forming a display portion on the barrier layer, the display portion comprising a thin film transistor;
covering the display portion with an encapsulation layer; and
forming a moisture absorption layer between the flexible substrate and the thin film transistor of the display portion,
wherein the barrier layer and the moisture absorption layer are each continuous across the display portion.

8. The method of claim 7, wherein the moisture absorption layer comprises CaO and/or MgO.

9. The method of claim 7, wherein the moisture absorption layer is formed between the flexible substrate and the barrier layer.

10. The method of claim 7, wherein the flexible substrate comprises a plurality of flexible substrates and the barrier layer comprises a plurality of barrier layers, the flexible substrates and the barrier layers being alternately stacked, and
wherein the moisture absorption layer is between a first flexible substrate of the plurality of flexible substrates and a first barrier layer of the plurality of barrier layers, the first flexible substrate being closest to the display portion from among the plurality of flexible substrates and the first barrier layer being closest to the display portion from among the plurality of barrier layers.

11. The method of claim 7, wherein the moisture absorption layer is between the barrier layer and the display portion.

12. The method of claim 7, wherein the flexible substrate comprises a plurality of flexible substrates and the barrier layer comprises a plurality of barrier layers, the flexible substrates and the barrier layers being alternately stacked, and
wherein the moisture absorption layer is formed between a first barrier layer closest to the display portion from among the plurality of barrier layers and the display portion.

13. A flexible organic light-emitting display apparatus comprising:
a flexible substrate, a barrier layer on the flexible substrate;
a display portion on the barrier layer;
an encapsulation layer covering the display portion; and
a moisture absorption layer between the flexible substrate and the display portion,
wherein the flexible substrate comprises a plurality of flexible substrates and the barrier layer comprises a plurality of barrier layers, the flexible substrates and the barrier layers being alternately stacked, and
wherein the moisture absorption layer is between a first flexible substrate of the plurality of flexible substrates and a first barrier layer of the plurality of barrier layers, the first flexible substrate being closest to the display portion from among the plurality of flexible substrates and the first barrier layer being closest to the display portion from among the plurality of barrier layers.

* * * * *